United States Patent
Cui et al.

(10) Patent No.: US 9,647,661 B2
(45) Date of Patent: May 9, 2017

(54) TEMPERATURE COMPENSATION CIRCUIT, TEMPERATURE COMPENSATION METHOD AND LIQUID CRYSTAL DISPLAY

(71) Applicants: BOE Technology Group Co., Ltd., Beijing (CN); Beijing BOE Optoelectronics Technology Co., Ltd., Beijing (CN)

(72) Inventors: Ziwei Cui, Beijing (CN); Luyang Wang, Beijing (CN); Long Zhao, Beijing (CN); Qi Sun, Beijing (CN)

(73) Assignees: BOE Technology Group Co., Ltd., Beijing (CN); Beijing BOE Optoelectronics Technology Co., Ltd., Beijing (CN)

( * ) Notice: Subject to any disclaimer, the term of this patent is extended or adjusted under 35 U.S.C. 154(b) by 8 days.

(21) Appl. No.: 14/600,893

(22) Filed: Jan. 20, 2015

(65) Prior Publication Data
US 2016/0149574 A1  May 26, 2016

(30) Foreign Application Priority Data
Nov. 20, 2014 (CN) .......................... 2014 1 0670222

(51) Int. Cl.
*G09G 5/10* (2006.01)
*H03K 19/003* (2006.01)
*G09G 3/36* (2006.01)

(52) U.S. Cl.
CPC ..... *H03K 19/00369* (2013.01); *G09G 3/3696* (2013.01); *G09G 3/3655* (2013.01); *G09G 2320/041* (2013.01)

(58) Field of Classification Search
CPC ......... G09G 2320/04; G09G 2320/041; G09G 2320/0204
(Continued)

(56) References Cited

U.S. PATENT DOCUMENTS 6,414,740 B1 * 7/2002 Hosoyamada .... G02F 1/133382
349/161
6,803,899 B1 * 10/2004 Masazumi ........... G09G 3/3629
345/101
(Continued)

FOREIGN PATENT DOCUMENTS

CN  102201217 A  9/2011
CN  103295541 A  9/2013
(Continued)

OTHER PUBLICATIONS

Mar. 4, 2016—(CN)—First Office Action Appn 201410670222.4 with English Tran.

*Primary Examiner* — Dinh T Le
(74) *Attorney, Agent, or Firm* — Banner & Witcoff, Ltd.

(57) ABSTRACT

Disclosed are a temperature compensation circuit for a display panel, a temperature compensation method and a liquid crystal display. The temperature compensation circuit comprises: a temperature detection unit configured to detect a variation in the temperature; a temperature conversion unit configured to convert the detected variation in the temperature into a voltage compensation value; and a compensation signal generation unit configured to process the voltage compensation value to generate a compensation signal. According to the embodiments of the present disclosure, the common electrode voltage of the display panel can be adjusted in real-time when the temperature varies, so that an amount of flickers presented on the display panel with an polarity inversion can be maintained at minimum, and thus a displaying of picture can be more stable and a visual experience of a viewer can be enhanced.

17 Claims, 13 Drawing Sheets

(58) Field of Classification Search
USPC .................. 345/212, 690, 101, 102, 691
See application file for complete search history.

(56) References Cited

U.S. PATENT DOCUMENTS

| | | | | |
|---|---|---|---|---|
| 7,859,511 B2* | 12/2010 | Shen | ............... | G09G 3/3696 |
| | | | | 345/101 |
| 2010/0277519 A1* | 11/2010 | Lee | ............... | G09G 3/3406 |
| | | | | 345/691 |
| 2011/0096105 A1* | 4/2011 | Park | ............... | H04N 13/0452 |
| | | | | 345/690 |

FOREIGN PATENT DOCUMENTS

| | | |
|---|---|---|
| CN | 203456073 U | 2/2014 |
| JP | 2007232982 A | 9/2007 |
| KR | 20040061756 A | 7/2004 |
| TW | I408653 A | 5/2010 |

* cited by examiner

TEMPERATURE COMPENSATION CIRCUIT, TEMPERATURE COMPENSATION METHOD AND LIQUID CRYSTAL DISPLAY This application claims priority to Chinese Patent Application No. CN 201410670222.4, filed on November 20, 2014. The present application claims priority to and the benefit of the above-identified application and is incorporated herein in its entirety.

TECHNICAL FIELD

The present disclosure relates to a filed of liquid crystal display, and particularly to a temperature compensation circuit, a temperature compensation method, which are used for a liquid crystal display panel, and a liquid crystal display comprising the temperature compensation circuit.

BACKGROUND

In an existing liquid crystal display panel, liquid crystal molecules are generally driven by a manner of polarity inversion. There are many manners for the polarity inversion, for example, a frame inversion, a column inversion, a row inversion and a dot inversion. However, a picture displayed in the panel may flicker as the polarity inversion is performed, especially in a case of the frame inversion. By referring to FIG. 1, as the frame inversion is performed, the whole picture has a same polarity, and two adjacent frames are inverted because a picture with a positive polarity and a picture with a negative polarity alternate. However, an actual voltage on a pixel is a difference between a voltage on its pixel electrode and a common electrode voltage Vcom, and absolute values of the actual pixel voltages applied to the pixel would be different in the successive two frames when the common electrode voltage Vcom drifts for some reasons, such as the temperature even if the absolute value of the gray scale voltage with positive polarity and that of the gray scale voltage with negative polarity are identical. For example, a variation range for a gray scale voltage of a video signal is between 0 V~10 V, and if the common electrode voltage Vcom drifts to 5.5 V from 5 V, a voltage difference for the positive polarity decreases to 4.5 V, while a voltage difference for the negative polarity increases to 5.5 V, and such a variation would be converted into a brightness difference and leads to a flicker phenomenon being perceivable by human.

Therefore, the common electrode voltage may generally drifts when the temperature of the liquid crystal display panel varies, which may in turn result in the occurring of the flickers in the pictures displayed in the liquid crystal display panel.

SUMMARY

In view of this, there is proposed a temperature compensation circuit for a liquid crystal display panel, a temperature compensation method and a liquid crystal display comprising the temperature compensation circuit, which are capable of adjusting a common electrode voltage Vcom according to a variation in a temperature so as to change an actual voltage applied to a pixel, so that variation ranges of gray scale voltages of positive and negative polarities are close to each other. In other words, the common electrode voltage can be adjusted in real-time when the temperature varies; therefore the common electrode voltage is at a midpoint between ranges of the positive and negative gray scales, so that an amount of flickers presented on the display panel as a polarity inversion is performed can be maintained minimum, and thus a displayed picture can be more stable and a visual experience of a viewer can be improved.

Accordingly, a temperature sensor may be incorporated to a Flexible Printed Circuit (FPC) board for providing driving signals to the display panel or be disposed at Thin Film Transistors (TFTs) side inside the display panel, and a corresponding temperature compensation circuit may be designed in order that the common electrode voltage is adjusted in real-time according to the variation in the temperature, so that the amount of flickers presented on the display panel can be maintained at minimum, and thus a display quality of picture can be ensured and a viewing experience of a user can be enhanced.

According to an aspect of the present disclosure, there is provided a temperature compensation circuit for a display panel, comprising: a temperature detection unit configured to detect a variation in the temperature; a temperature conversion unit configured to convert the detected variation in the temperature into a voltage compensation value; and a compensation signal generation unit configured to process the voltage compensation value to generate a compensation signal for performing a temperature compensation on a common electrode voltage of the display panel.

In an example, the compensation signal generation unit comprises at least one of a plurality of compensation sub-units: an addition compensation sub-unit, a subtraction compensation sub-unit, a multiplication compensation sub-unit and a division compensation sub-unit.

In an example, the above-described temperature compensation circuit further comprises: a selection unit configured to select at least one of the compensation sub-units in the compensation signal generation unit to process the voltage compensation value, in order to generate the compensation signal.

In an example, the above-described temperature compensation circuit further comprises: a storage unit configured to store amounts of flicker of the display panel at different temperatures and corresponding common electrode voltage values; an identification unit configured to identify a function relationship between the temperature and the common electrode voltage value when the display panel presents a minimum amount of flicker based on the stored amounts of flicker at the different temperatures and the corresponding common electrode voltage values, and to output a control signal to the selection unit.

In an example, the selection unit selects the at least one of the plurality of compensation sub-units to generate the compensation signal according to the control signal output from the identification unit.

In an example, in the above-described temperature compensation circuit, the temperature conversion unit comprises: a first operational amplifier, wherein a non-inverting input terminal of the first operational amplifier is configured to receive the variation in temperature output from the temperature detection unit, an inverting input terminal thereof is grounded via a first resistor, and an output terminal thereof is connected to the inverting input terminal via a first feedback resistor and outputs the converted voltage compensation value.

In an example, in the above-described temperature compensation circuit, the temperature detection unit comprises: a temperature sensor, which is a thermistor, disposed on a signal driving circuit board of the display panel to detect an external temperature of the display panel.

In an example, in the above-described temperature compensation circuit, the temperature detection unit comprises: a temperature sensor, which is made of polysilicon, disposed at Thin Film Transistors side inside the display panel to detect an internal temperature of the display panel.

In an example, in the above-described temperature compensation circuit, the addition compensation sub-unit comprises a second operational amplifier whose non-inverting input terminal configured to receive the voltage compensation value and the common electrode voltage via a second resistor and a third resistor, respectively, whose inverting input terminal configured to be grounded via a fourth resistor, and whose output terminal configured to be connected to the inverting input terminal thereof via a second feedback resistor and to output a sum of the common electrode voltage signal and the voltage compensation value as a compensation signal.

In an example, in the above-described temperature compensation circuit, the subtraction compensation sub-unit comprises a third operational amplifier whose non-inverting input terminal and inverting input terminal configured to receive the common electrode voltage and the voltage compensation value via a fourth resistor and a fifth resistor, respectively, and whose output terminal configured to be connected to the inverting input terminal thereof via a third feedback resistor and to output a difference between the common electrode voltage signal and the voltage compensation value as a compensation signal.

In an example, in the above-described temperature compensation circuit, the multiplication compensation sub-unit comprises a fourth operational amplifier configured to perform a logarithm operation on a first signal received at its inverting input terminal and output the same; a fifth operational amplifier configured to perform a logarithm operation on a second signal received at its inverting input terminal and output the same; a sixth operational amplifier configured to perform an addition operation on signals output from the fourth operational amplifier and the fifth operational amplifier; and a seventh operational amplifier configured to perform an exponent operation on a signal output from the sixth operational amplifier and output a product of the first signal and the second signal as a compensation signal.

In an example, in the above-described temperature compensation circuit, the division compensation sub-unit comprises: an eighth operational amplifier configured to perform a logarithm operation on a first signal received at its inverting input terminal and output the same; a ninth operational amplifier configured to perform a logarithm operation on a second signal received at its inverting input terminal and output the same; a tenth operational amplifier configured to perform a subtraction operation on signals output from the eighth operational amplifier and the ninth operational amplifier; and an eleventh operational amplifier configured to perform an exponent operation on a signal output from the tenth operational amplifier in order to generate a compensation signal.

According to another aspect of the present disclosure, there is provided a liquid crystal display comprising the temperature compensation circuit described above.

According to a further aspect of the present disclosure, there is provided a temperature compensation method for a display panel, comprising: detecting a variation in the temperature of the display panel; converting the detected variation in the temperature into a voltage compensation value; and generating a compensation signal for performing a temperature compensation on a common electrode voltage of the display panel based on the voltage compensation value.

In an example, the above-described temperature compensation method further comprises: storing amounts of flicker of the display panel at different temperatures and corresponding common electrode voltage values; identifying a function relationship between the temperature and the common electrode voltage value when the display panel presents a minimum amount of flicker based on the stored amounts of flicker of the display panel at the different temperatures and the corresponding common electrode voltage values; and based on the identified function relationship, performing corresponding processing on the voltage compensation value to generate a compensation signal.

According to the temperature compensation circuit, the temperature compensation method according to the embodiments of the present disclosure, the common electrode voltage of the display panel can be adjusted in real-time when the temperature varies, therefore the common electrode voltage is at a midpoint between variations of the positive and negative gray scales, so that an amount of flickers presented on the display panel with an polarity inversion can be maintained at minimum, and thus a displaying of picture can be more stable and a visual experience of a viewer can be enhanced.

BRIEF DESCRIPTION OF THE DRAWINGS

In order to illustrate the solutions in embodiments of the present disclosure or the prior art more clearly, drawings required as describing the embodiments of the present disclosure or the prior art will be introduced briefly below. Obviously, the drawings described below only involve some embodiments of the present disclosure, but are not limitative of the present disclosure and wherein.

DETAILED DESCRIPTION

Thereafter, solutions of embodiments of the present disclosure will be described clearly and completely in connection with drawings of the embodiments of the present disclosure; obviously, the described embodiments are only some, but not all of the embodiments of the present disclosure. Any other embodiments obtained by those ordinary skilled in the art based on the embodiments of the present disclosure without inventive labors should fall into a scope sought for protection in the present disclosure.

Figure 1:
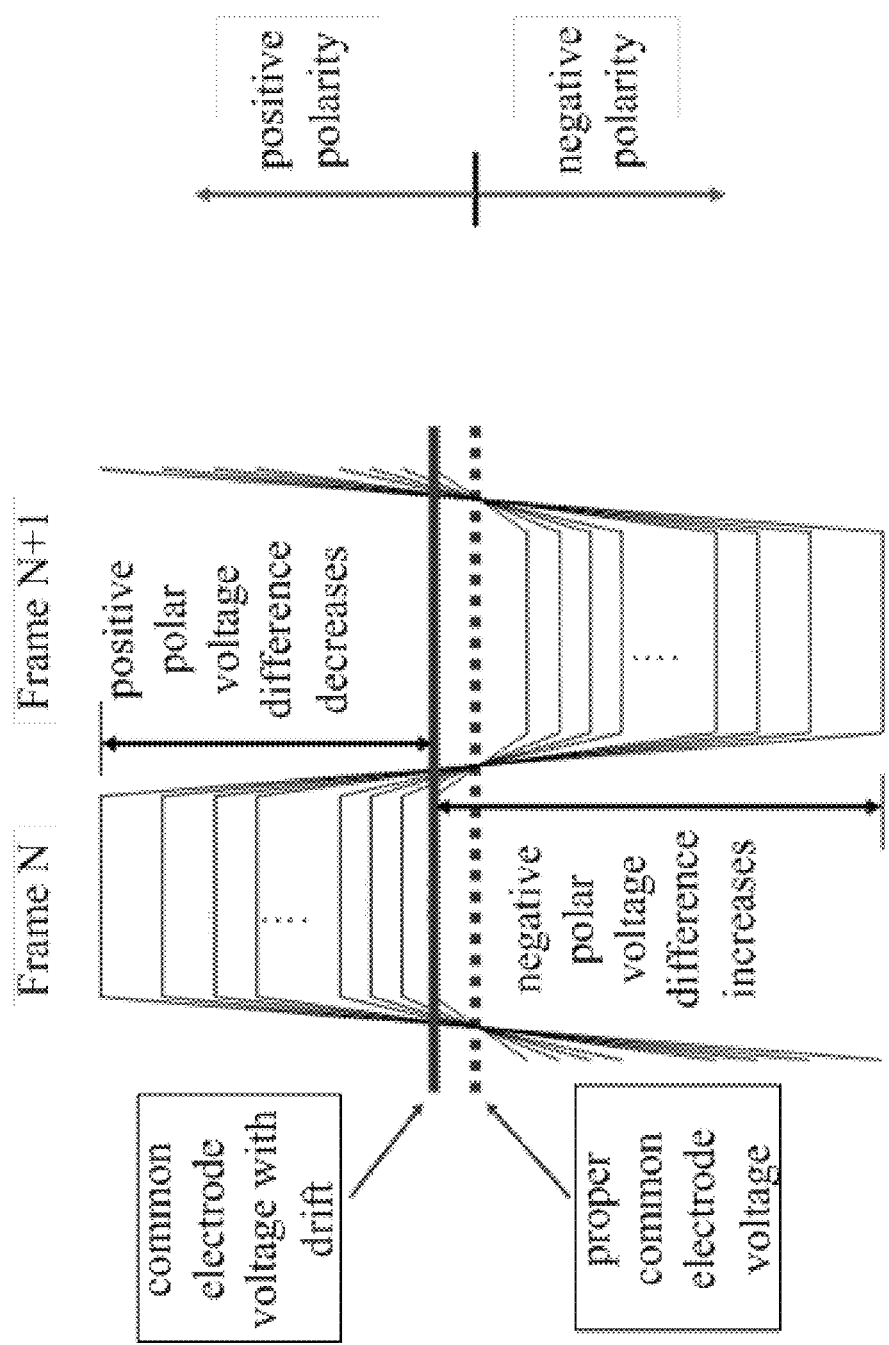
FIG. 1 is an exemplary view illustrating a principle of occurring of flickers caused when a common electrode voltage Vcom drifts as a polarity inversion is performed on a display panel.
Figure 2:
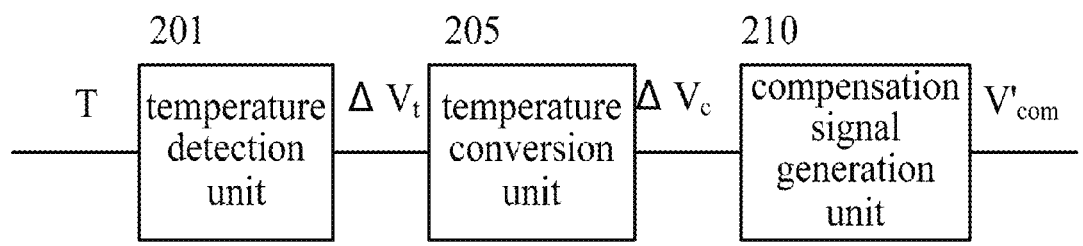
FIG. 2 is an exemplary block diagram of a temperature compensation circuit according to an embodiment of the present disclosure.

FIG. 2 is an exemplary block diagram of a temperature compensation circuit according to an embodiment of the present disclosure. As illustrated in FIG. 2, the temperature compensation circuit comprises: a temperature detection unit 201 configured to detect variations ΔT in the temperature of a display panel; a temperature conversion unit 205 configured to convert the variation ΔT in the temperature detected by the temperature detection unit 201 into a voltage compensation value ΔV; and a compensation signal generation unit 210 configured to generate a compensation signal V' com for performing a temperature compensation on a common electrode voltage Vcom of the display panel based on the voltage compensation value ΔV.

Figure 3:
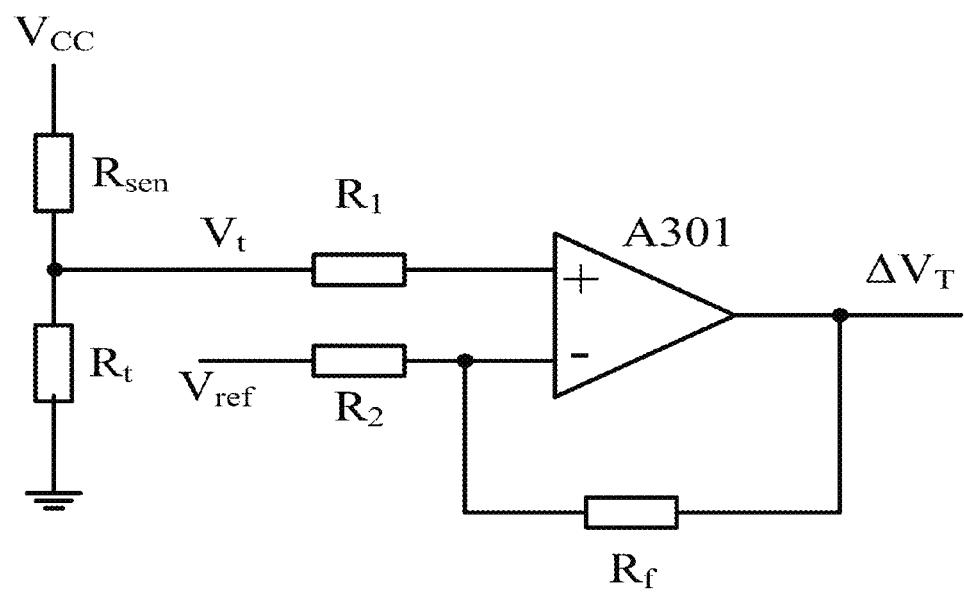
FIG. 3 is an exemplary circuit diagram of a temperature detection unit according to an embodiment of the present disclosure.

FIG. 3 illustrates an exemplary circuit of the temperature detection unit according to the embodiments of the present disclosure. As illustrated in FIG. 3, the temperature detection unit 301 may comprise a temperature sensor and a dividing resistor $R_t$, wherein the temperature sensor is a thermistor $R_{sen}$ and is disposed on a Flexible Printed Circuit (FPC) board for providing driving signals to the display panel. One terminal of the thermistor is connected to a reference voltage VCC, and the other terminal is grounded via the dividing resistor $R_t$, so that a voltage $$V_t = \frac{V_{ref} * R_t}{R_t + R_{sen}}$$

can be obtained with such a voltage dividing circuit. It can be seen that a variation in the voltage value $V_t$ reflects a variation in resistance of the thermistor and in turn reflects a variation in the temperature.

In this circuit, the thermistor has a Negative Temperature Coefficient (NTC), whose resistance decreases as the temperature rises. Alternatively, the thermistor may also have a Positive Temperature Coefficient (PTC) depending on actual requirements, whose resistance increases as the temperature rises.

In an example, the voltage value $V_t$ may be compared to the reference voltage value $V_{ref}$ to obtain a variation ΔV in the voltage value $V_t$, $ΔV=K(V_t-V_{ref})$, which may reflect the variation ΔT in temperature directly. For example, as illustrated in FIG. 3, the variation in voltage corresponding to the variation in temperature may be obtained by a differential circuit implemented with operational amplifiers according to the measured voltage values of the thermistor. In particular, the $V_t$ is connected to a non-inverting input terminal of the operational amplifier via a resistor $R_1$, the reference voltage value $V_{ref}$ is connected to an inverting input terminal of the operational amplifier via a resistor $R_2$, and an output terminal of the operational amplifier is connected to the inverting input terminal via a feedback resistor $R_f$. According to a principle of the operational amplifier, it can be known that $$\frac{V_0}{R_f} = V_t * \left(\frac{1}{R_2} + \frac{1}{R_f}\right) - \frac{V_{ref}}{R_2},$$

so $ΔV=K(V_t-V_{ref})=KΔV_T$ may be realized by selecting resistances of the $R_2$ and $R_f$.

Figure 4:
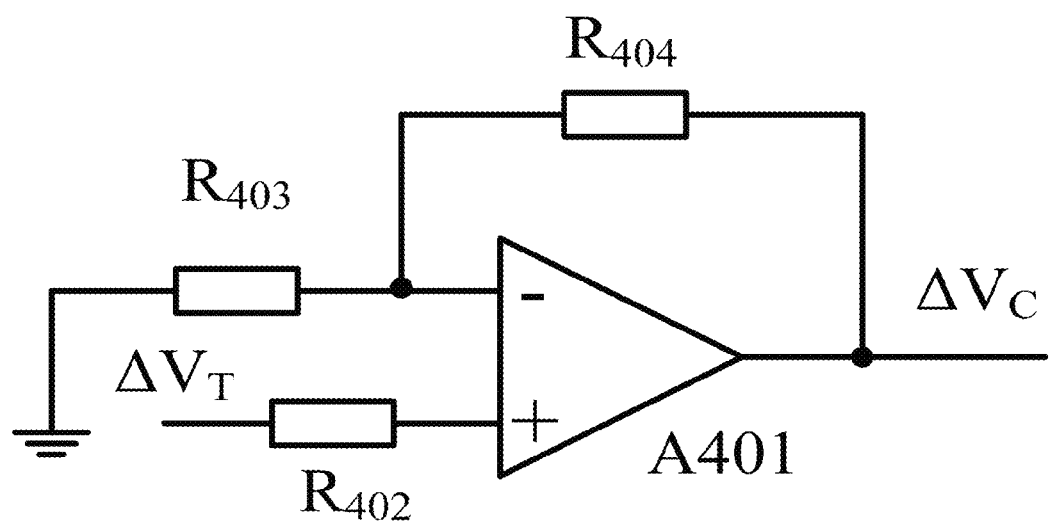
FIG. 4 is an exemplary circuit diagram of a temperature conversion unit according to an embodiment of the present disclosure.

FIG. 4 illustrates an exemplary circuit of a temperature conversion unit according to an embodiment of the present disclosure. In this circuit, the temperature conversion unit is implemented with an operational amplifier A401 which is configured as a non-inverting amplifier. Particularly, a non-inverting input terminal of the operational amplifier A401 is configured to receive the voltage signal output from the temperature detection unit 301, and its inverting input terminal is connected to an output terminal of this operational amplifier through a resistor feedback network. This temperature conversion unit can realize a transform of impedance and an isolation of signals, and also can amplify the detection signal from the temperature detection unit. Specifically, $$ΔV_c = ΔV(1+R_{404}/R_{403}).$$

FIG. 3 and FIG. 4 illustrate the exemplary circuits of the temperature detection unit and the temperature conversion unit according to the embodiments of the present disclosure, respectively, however, the temperature detection unit and the temperature conversion unit according to the embodiments of the present disclosure are not limited to such circuits. For example, in the temperature detection unit, the temperature sensor may also be made of polysilicon and disposed at Thin Film Transistors (TFTs) side inside the display panel to detect variations in temperature inside the display panel. Further, besides the non-inverting proportional operational circuit illustrated in FIG. 4, other operational circuit, for example, an inverting proportional operational circuit, a differential proportional operational circuit, etc., may be utilized to implement the temperature conversion unit, in order to convert the variations in temperature into the voltage compensation values and realize the transform of impedance and the isolation of signals at the same time. Detailed structures of the circuits would be omitted herein.

Figure 5:
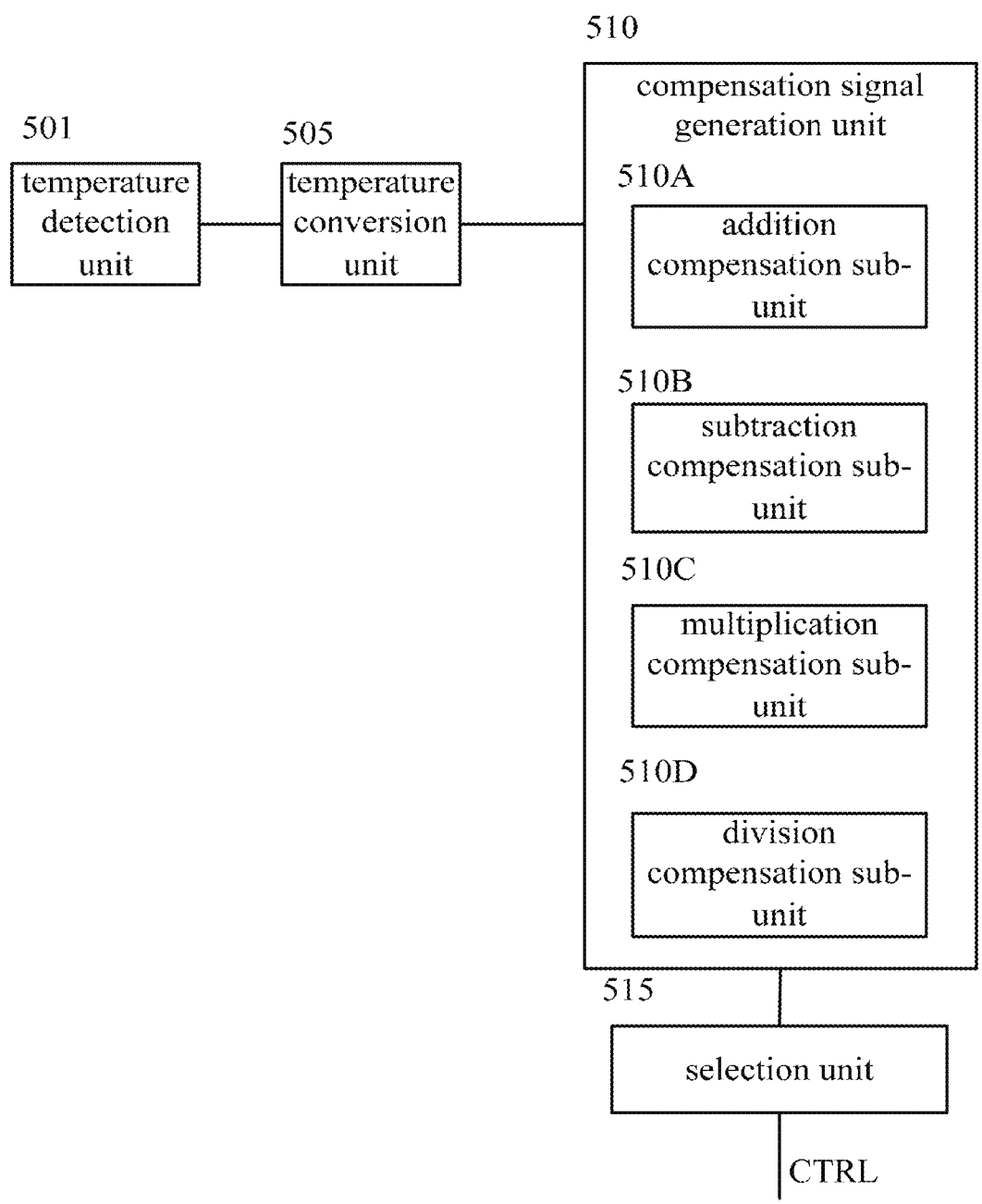
FIG. 5 is an exemplary block diagram of another temperature compensation circuit according to an embodiment of the present disclosure.

FIG. 5 is an exemplary block diagram of a temperature compensation circuit according to another embodiment of the present disclosure. As compared with the temperature compensation circuit shown in FIG. 2, besides a temperature detection unit 501, a temperature conversion unit 505 and a compensation signal generation unit 510, the temperature compensation circuit further comprises a selection unit 515, and the compensation signal generation unit 510 further comprises an addition compensation sub-unit 510A, a subtraction compensation sub-unit 510B, a multiplication compensation sub-unit 510C and a division compensation sub-unit 510D. In an example, the selection unit 515 selects the corresponding compensation sub-unit to process the voltage compensation value output from the temperature conversion unit according to a control signal received at a control terminal CTRL, in order to generate the corresponding compensation signal. In an example, the control signal may be a digital signal input externally from the temperature compensation circuit. For example, in a case where an actual function relationship between the temperature and the common electrode voltage when the display panel presents the minimum amount of flicker is an addition function relationship, the digital signal may be input into the control terminal CTRL directly to select the corresponding compensation sub-unit so as to generate the compensation signal applied to the common electrode. For details, please refer to following description.

Furthermore, although FIG. 5 only illustrates the four compensation sub-units, that is, the addition compensation sub-unit 510A, the subtraction compensation sub-unit 510B, the multiplication compensation sub-unit 510C and the division compensation sub-unit 510D, those skilled in the art can also dispose any other suitable compensation sub-units, such as an exponent compensation sub-units, a logarithm compensation sub-unit, etc., according to the actually determined function relationship between the temperature of the display panel and the common electrode voltage value, such as an exponent function, a logarithm function, etc., in order to compensate the common electrode voltage of the display panel.

Figure 6:
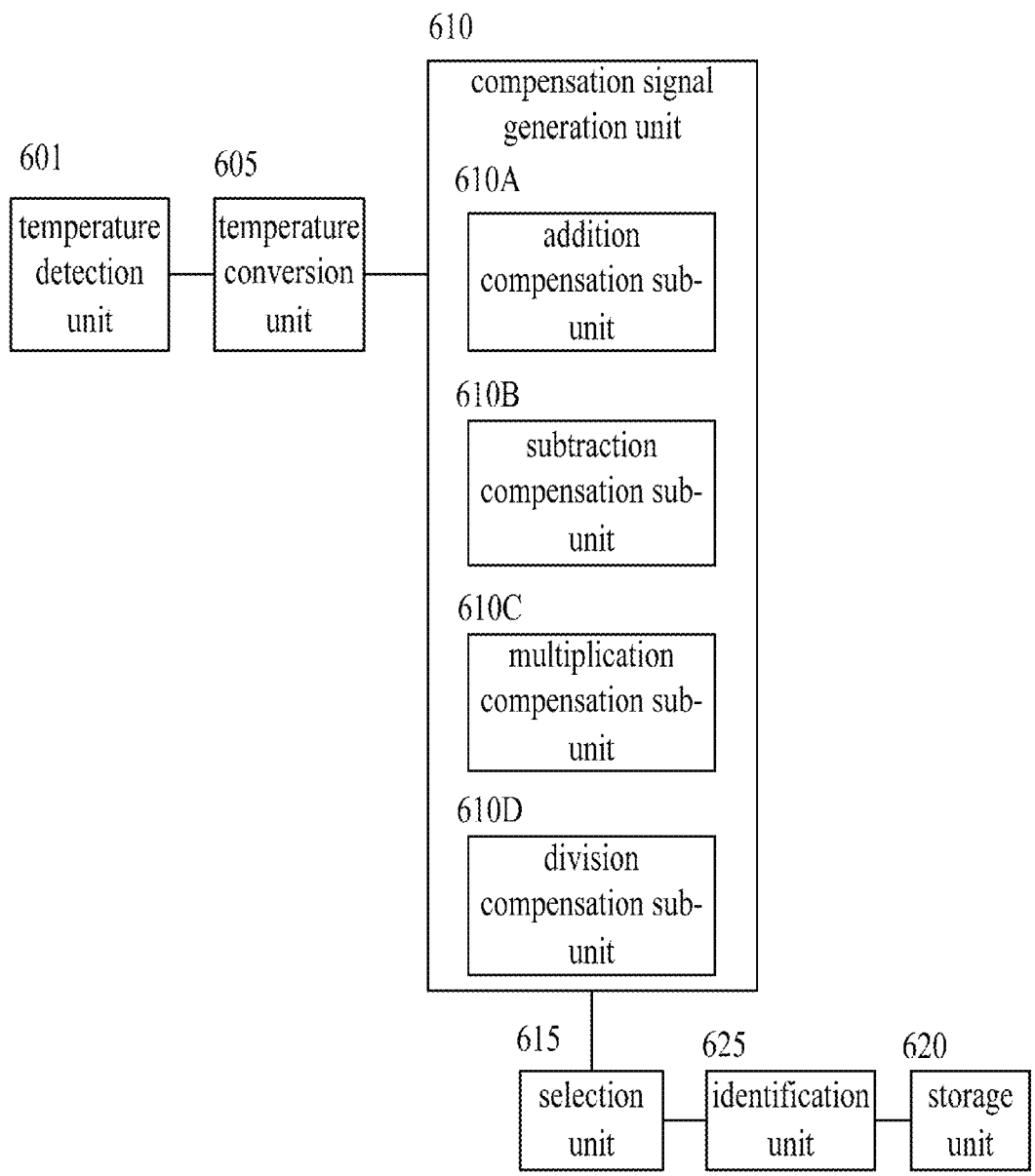
FIG. 6 is an exemplary block diagram of a further temperature compensation circuit according to an embodiment of the present disclosure.

FIG. 6 illustrates an exemplary block diagram of a temperature compensation circuit according to a further embodiment of the present disclosure. As compared with the temperature compensation circuit shown in FIG. 5, besides a temperature detection unit 601, a temperature conversion unit 605, a selection unit 615 and a compensation signal generation unit 610, it further comprises: a storage unit 620 configured to store amounts of flicker presented on the display panel as testing pattern(s) (for example, a flicker pattern) is displayed at different temperatures and corresponding common electrode voltage values; and an identification unit 625 configured to identify the function relationship between the temperature and the common electrode voltage value when the display panel presents the minimum amount of flicker based on the stored amounts of flicker of the display panel at the different temperatures and the corresponding common electrode voltage values, and to output the control signal to the selection unit.

According to the embodiments of the present disclosure, assuming that the function relationship between the temperature Tem(T) and the common electrode voltage Vcom (V) obtained by the identification unit 625 is as follows in a case of the minimum amount of flicker Flicker(F).

(1) Addition Relationship $mT+nV=k$ (k, m and n are coefficients).

A relationship between the variation $\Delta V$ in voltage and the variation $\Delta T$ in temperature is:

$$\Delta V = -(m\Delta T)/n.$$

It can be seen that, a change direction of the common electrode voltage should be opposite that of the temperature in order to ensure the minimum amount of flicker, so that the compensation for the temperature is realized.

The compensated common electrode voltage is V'com=Vcom+$\Delta V$=Vcom−$(m\Delta T)/n$.

Therefore, Vcom−$(m\Delta T)/n$ can be implemented by the subtraction compensation sub-unit, so that the compensated common electrode voltage V'com is obtained.

(2) Subtraction Relationship $$mT - nV = k.$$

A relationship between the variation $\Delta V$ in voltage and the variation $\Delta T$ in temperature is:

$$\Delta V = (m\Delta T)/n.$$

It can be seen that, a change direction of the common electrode voltage should be same as that of the temperature in order to ensure the minimum amount of flicker, so that the compensation for the temperature is realized.

The compensated common electrode voltage is V'com=Vcom+$\Delta V$=Vcom+$(m\Delta T)/n$.

Therefore, Vcom+$(m\Delta T)/n$ can be implemented by the addition compensation sub-unit, so that the compensated common electrode voltage V'com is obtained.

(3) Multiplication Relationship $$mT*nV = k,$$

$$V = k/(mnT),$$

$$V'\text{com} = k/(mnT').$$

Therefore, the corresponding compensated common electrode voltage V'com can be generated by the division compensation sub-unit according to the varied temperature.

(4) Division Relationship $$mT/nV = k,$$

$$\Delta V = m\Delta T/(k*n),$$

$$V'\text{com} = V\text{com} + \Delta V = V\text{com} + m\Delta T/(k*n).$$

Therefore, the corresponding compensated common electrode voltage V'com can be generated by the addition compensation sub-unit and a proportional compensation sub-unit, wherein the proportional compensation sub-unit may utilize the non-inverting proportional operational circuit shown in FIG. 4 or an inverting proportional operational circuit (not shown), and the structures are not repeated herein.

As an example, the above only gives descriptions of the principle for how to select the corresponding compensation sub-unit(s) to compensate for the common electrode voltage, with respect to the function relationship between the temperature and the common electrode voltage is addition, subtraction, multiplication or division in the case where the display panel presents the minimum amount of flicker.

In fact, according to the stored amounts of flicker Flicker of the display panel at the different temperatures Tem and the specific values of the common electrode voltage Vcom, the identification unit may also obtain other function relationships between the common electrode voltage values and the temperatures, for example, the exponent function relationship, the logarithm function relationship and the like. Based on the above principle of the present disclosure, those skilled in the art can design and select the corresponding compensation sub-unit to compensate for the common electrode voltage according to the obtained function relationship, and such variations also fall into the scope sought for protection in the present disclosure, but details are omitted herein.

FIGS. 7A-7D illustrate exemplary circuits of the addition compensation sub-unit, the subtraction compensation sub-unit, the multiplication compensation sub-unit and the division compensation sub-unit according to the embodiments of the present disclosure, respectively.

Figure 7A:
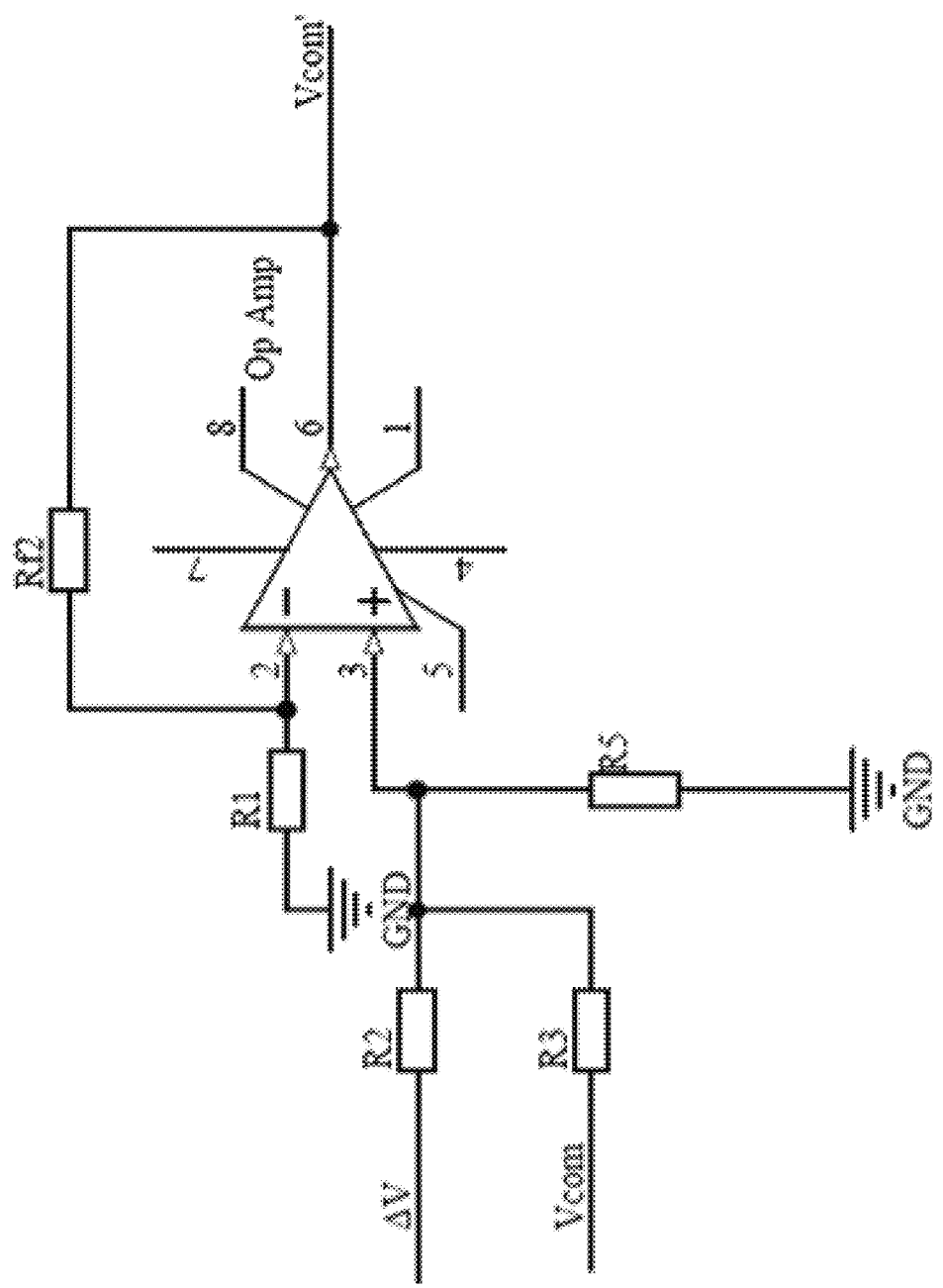
FIGS. 7A-7D illustrate exemplary circuits of an addition compensation sub-unit, a subtraction compensation sub-unit, a multiplication compensation sub-unit and a division compensation sub-unit according to the embodiments of the present disclosure, respectively.

As illustrated in FIG. 7A, the addition compensation sub-unit may comprise an operational amplifier A710, wherein the compensation value and the common electrode voltage are connected to a non-inverting input terminal of the operational amplifier A710 via resistors R2, R3, respectively, an output terminal of the operational amplifier A710 is connected to its inverting input terminal via a feedback resistor Rf2, so that an addition operation Vcom+$(m\Delta T)/n$ is implemented and the compensated common electrode voltage V'com is output to the common electrode of the display panel.

Figure 7B:
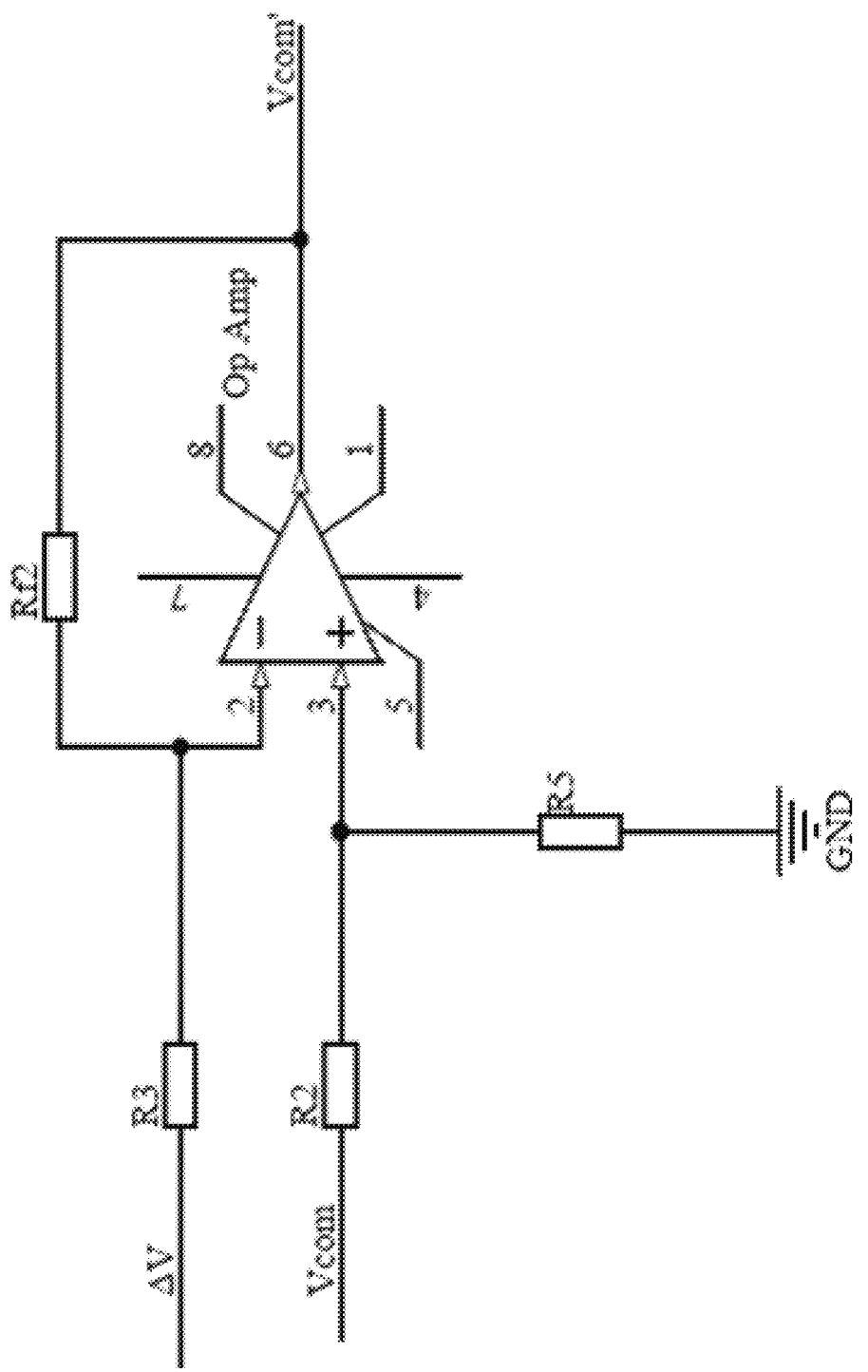

As illustrated in FIG. 7B, the subtraction compensation sub-unit may comprise an operational amplifier A720, wherein the compensation value and the common electrode voltage are connected to an inverting input terminal and a non-inverting input terminal of the operational amplifier A720 via resistors, respectively, an output terminal of the operational amplifier A720 is connected to its inverting input terminal via a feedback resistor Rf2, so that a subtraction operation Vcom−(mΔT)/n is implemented, and the compensated common electrode voltage V'com is output from the output of the operational amplifier.

Figure 7C:
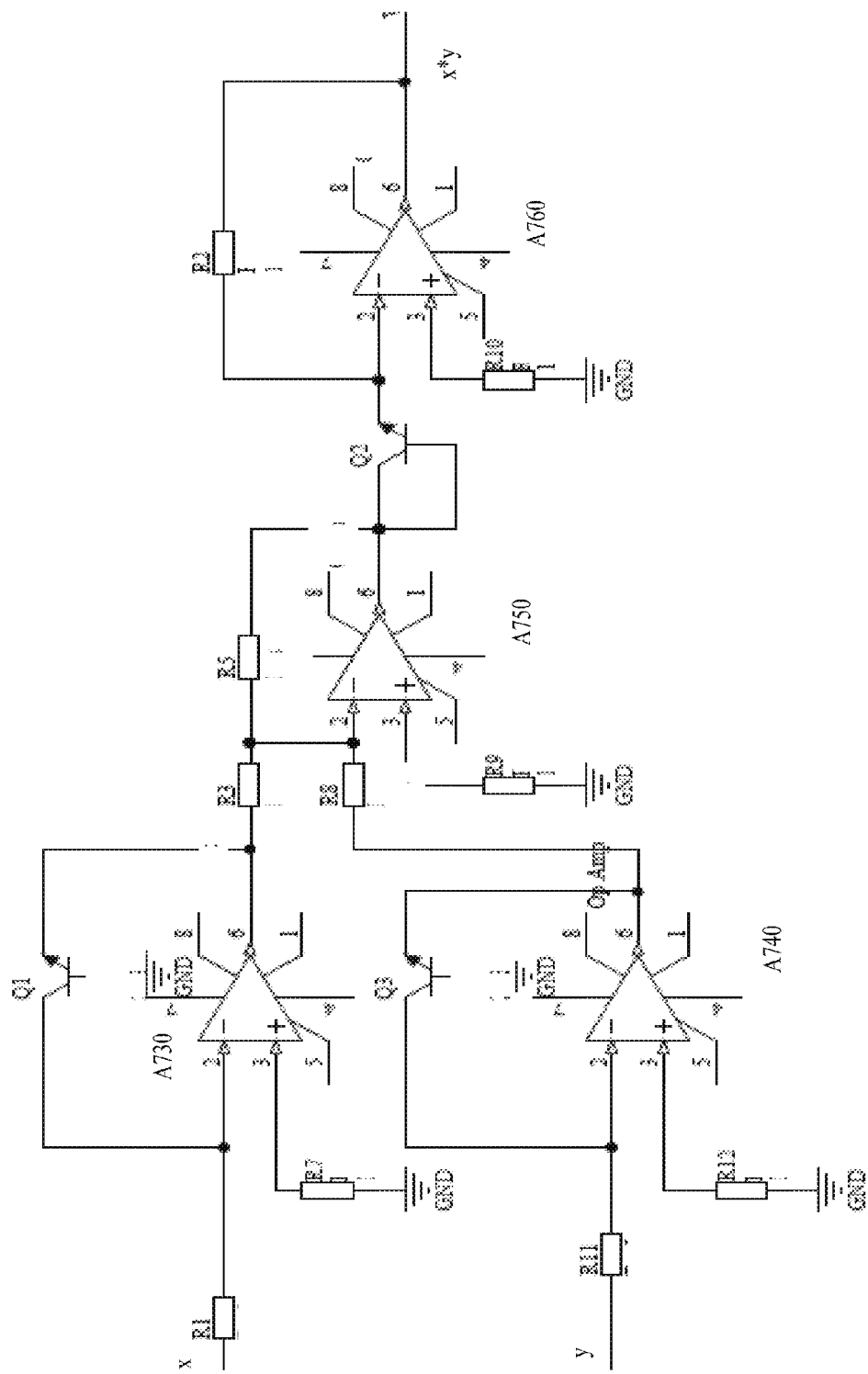

As illustrated in FIG. 7C, the multiplication compensation sub-unit may comprises: a fourth operational amplifier A730 configured to perform a logarithm operation lnx on a signal x received at its inverting input terminal; a fifth operational amplifier A740 configured to perform a logarithm operation lny on a signal y received at its inverting input terminal; a sixth operational amplifier A750 configured to perform an addition operation lnx+lny on signals output from the fourth operational amplifier and the fifth operational amplifier; and a seventh operational amplifier A760 configured to perform an exponent operation $e^{lnx+lny}$ on a signal output from the sixth operational amplifier A750 so as to generate a multiplication compensation signal xy.

Figure 7D:
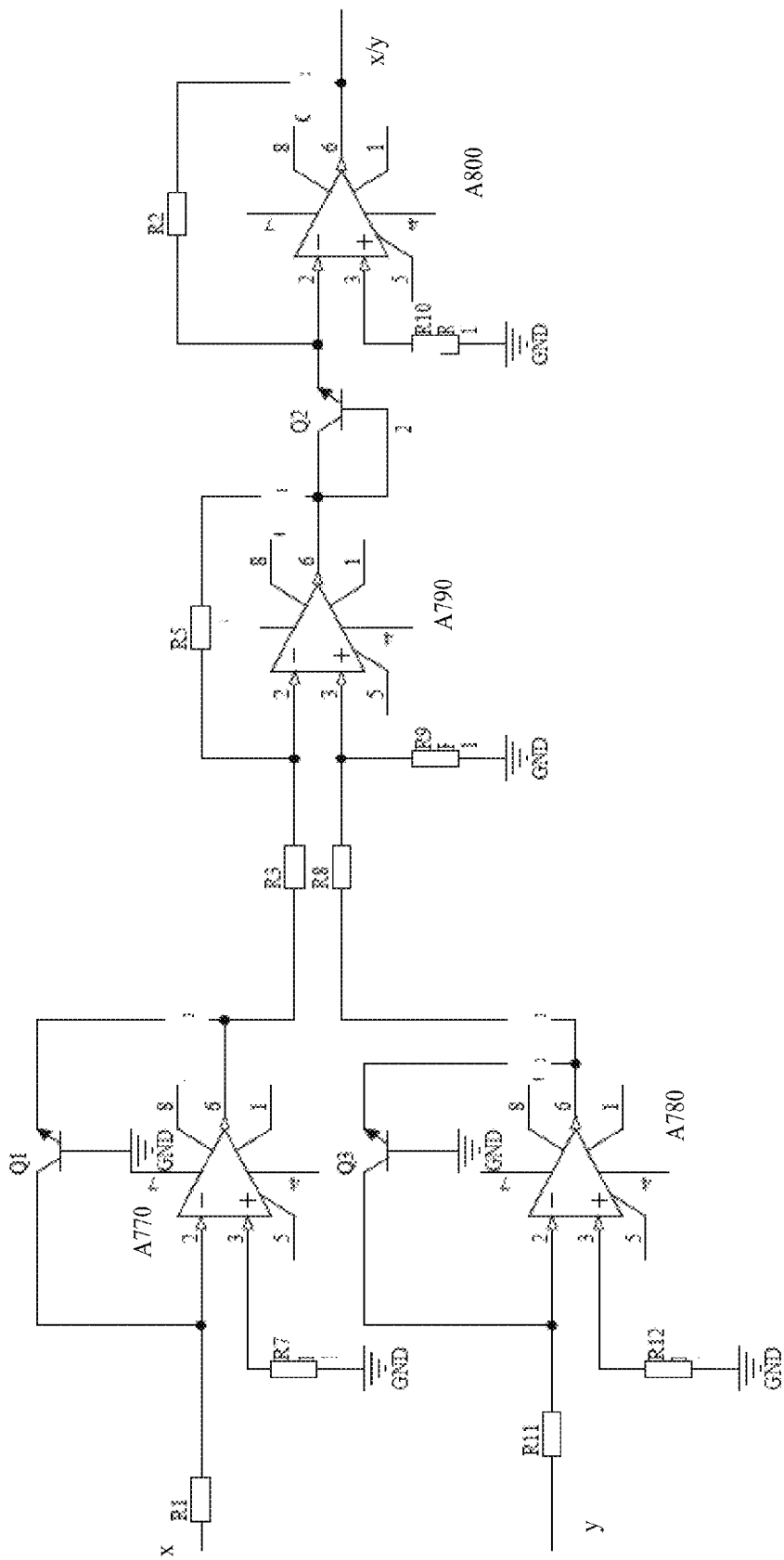

As illustrated in FIG. 7D the division compensation sub-unit may comprise: an eighth operational amplifier A770 configured to perform a logarithm operation lnx on a signal x (for example, a given reference signal $S_{ref}$) received at its inverting input terminal; a ninth operational amplifier A780 configured to perform a logarithm operation lny on a signal y (for example, a temperature signal T) received at its inverting input terminal; a tenth operational amplifier A790 configured to perform a subtraction operation lnx−lny on signals output from the eighth operational amplifier and the ninth operational amplifier; and an eleventh operational amplifier A800 configured to perform an exponent operation $e^{lnx-lny}$ on a signal output from the tenth operational amplifier in order to generate a division compensation signal x/y (for example, $S_{ref}/T$).

The above descriptions only give exemplary circuits of the addition compensation sub-unit, the subtraction compensation sub-unit, the multiplication compensation sub-unit and the division compensation sub-unit according to the embodiments of the present disclosure, but are not limitations on the present disclosure. As described above, those skilled in the art can easily design any other compensation sub-units different from the above compensation sub-units based on the principle of the present disclosure.

Below would give an example to describe how to obtain the function relationship between the temperature and the common electrode voltage value under given amounts of flicker. According this example, firstly, the amounts of flicker presented on the display panel are tested at the different temperatures by a group of test pictures, such as the Flicker Patterns; next, the common electrode voltage value is adjusted so that the amount of flicker presented on the display panel is minimum at that temperature, and the temperature and the corresponding common electrode voltage value are recorded and stored into the storage unit 620, as shown in following Table 1.

TABLE 1

| Tem | Flicker | Vcom(V) |
|---|---|---|
| 25° | 4.0% | −0.7 |
| 30° | 4.2% | −0.8 |
| 35° | 4.5% | −0.9 |
| 40° | 4.8% | −1.0 |
| 45° | 5.4% | −1.2 |
| 50° | 6.0% | −1.4 |

Figure 8:
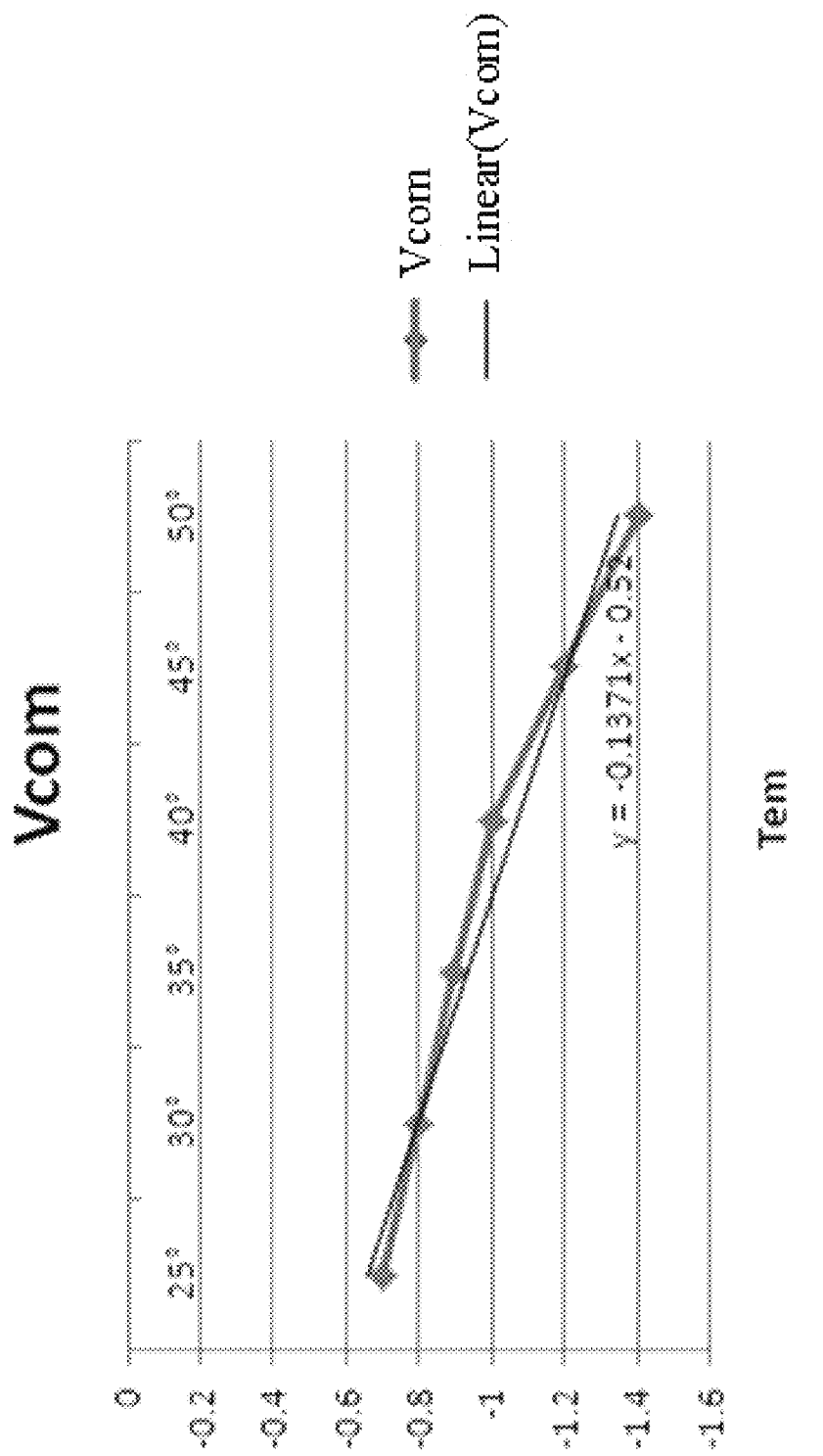
FIG. 8 is an exemplary schematic view for identifying a function relationship between a temperature and the common electrode voltage in a case that the display panel presents a minimum amount of flicker, according to an embodiment of the present disclosure.
Figure 9:
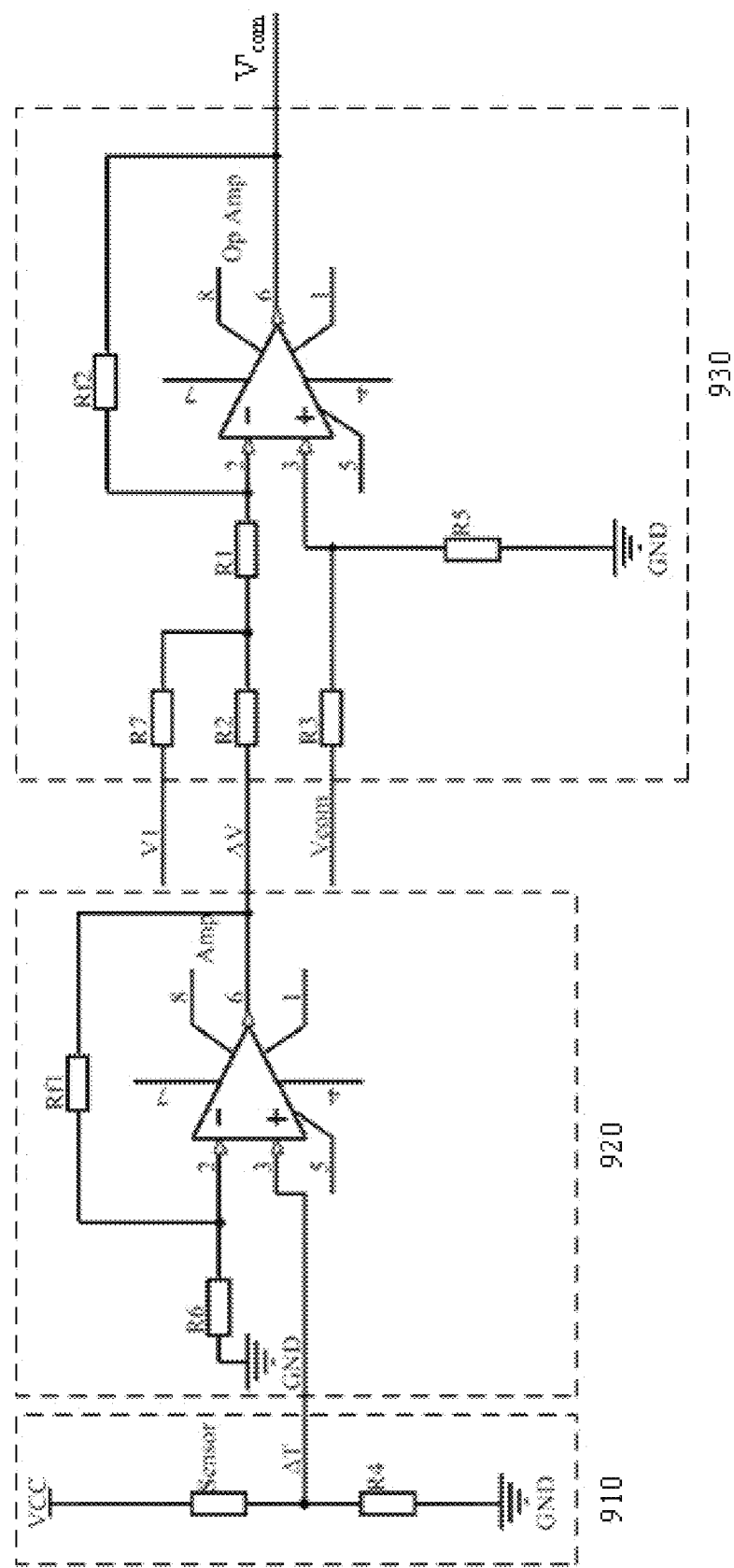
FIG. 9 is an exemplary structure diagram of the temperature compensation circuit implemented corresponding to the schematic view shown in FIG. 8, according to the embodiment of the present disclosure.

The identification unit 625 may obtain the function relationship between the temperature Tem and the common electrode voltage Vcom in the case of the minimum amount of flicker Flicker based on the values recorded in the Table 1 stored in the storage unit 620. For example, as illustrated in FIG. 8, a curve is drawn to represent the relationship between the temperature and the common electrode voltage value in the case of the minimum amount of flicker, wherein a horizontal axis denotes the temperature and a vertical axis denotes the common electrode voltage value. In order to simplify the calculation, a straight line may be obtained with a data fitting, so that the function relationship between the common electrode voltage and the temperature in the case of the minimum amount of flicker may be identified as a linear relationship, for example, $V_c = -0.1371 V_t 0.52$. Therefore, as described above, the subtraction compensation sub-unit may be selected to compensate for the common electrode voltage, that is, V'com=Vcom−(mΔT)/n, and its corresponding exemplary circuit is as illustrated in FIG. 9. First, the variation ΔT in temperature is detected by the temperature detection unit 910, and then is converted into the voltage compensation value ΔV through the temperature conversion unit 920, and the final compensation signal V'com is generated by the subtraction compensation sub-unit 930 and applied to the common electrode.

It should be understood that above examples are only exemplary descriptions for how to identify the relationship between the temperature and the common electrode voltage value in the case of minimum amount of flicker according to the principle of the embodiments of the present disclosure, instead of limitations on the present disclosure. Those skilled in the art can obtain the function relationship between the temperature and the common electrode voltage value under any given amount of flicker by any other manners based on the principle.

According to another aspect of the present disclosure, there is further provided a liquid crystal display comprising the temperature compensation circuit described above, so that the common electrode voltage of the display panel can be compensated automatically as the temperature varies, and thus the amount of flicker on the display panel can be minimized, which enhances the viewing experience of the users.

Figure 10:
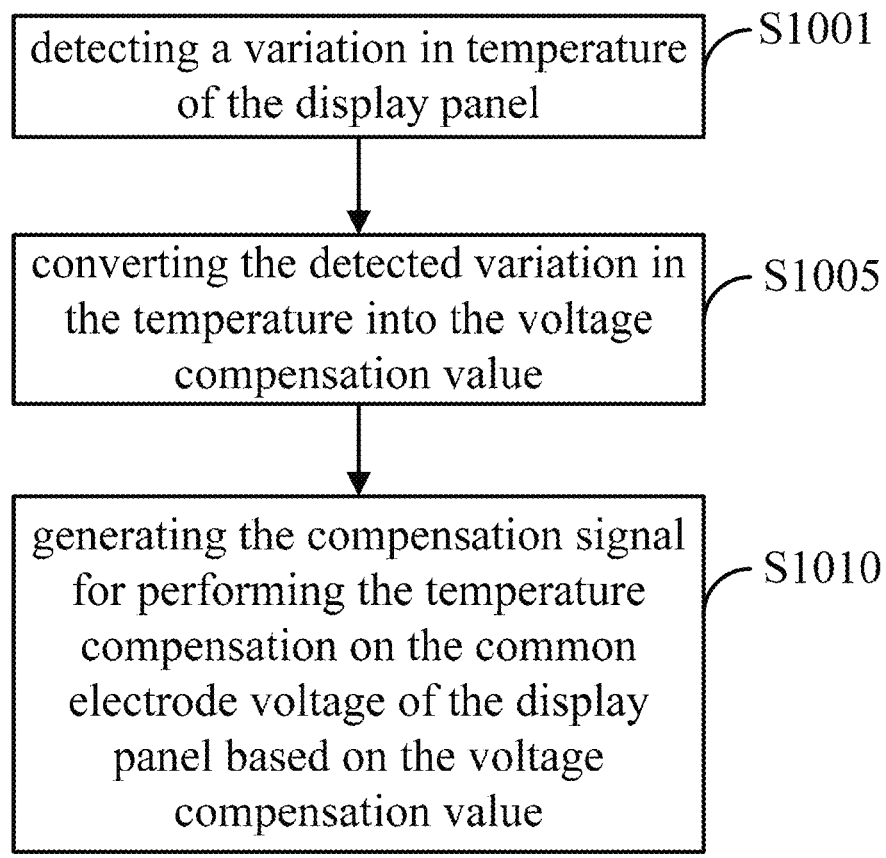
FIG. 10 is an exemplary flowchart of a temperature compensation method according to an embodiment of the present disclosure.

According to a further aspect of the present disclosure, there is provided a temperature compensation method for the display panel. In particular, as illustrated in FIG. 10, it comprises: detecting the variations in temperature of the display panel; converting the detected variation in the temperature into the voltage compensation value; and generating the compensation signal for performing the temperature compensation on the common electrode voltage of the display panel based on the voltage compensation value.

Figure 11:
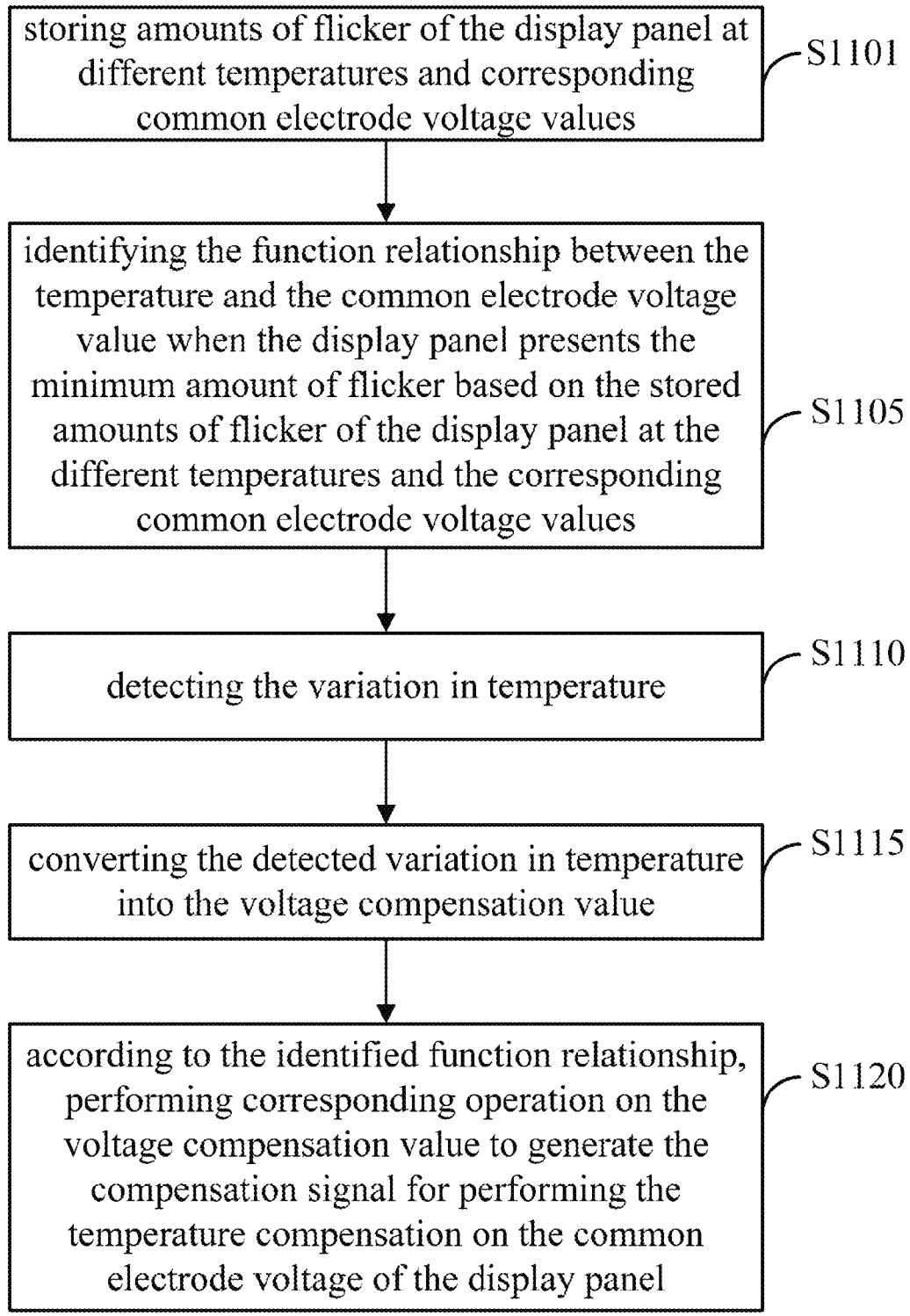
FIG. 11 is an exemplary flowchart of another temperature compensation method according to an embodiment of the present disclosure.

In an example, according to another aspect of the present disclosure, there is further proposed a temperature compensation method of the display panel. Particularly, as illustrated in FIG. 11, it comprises: storing amounts of flicker of the display panel at different temperatures and corresponding common electrode voltage values; identifying the function relationship between the temperature and the common electrode voltage value when the display panel presents the minimum amount of flicker based on the stored amounts of flicker of the display panel at the different temperatures and the corresponding common electrode voltage values; detecting the variation in temperature of the display panel; converting the detected variation in temperature into the voltage compensation value; and according to the identified function relationship, performing a corresponding operation on the voltage compensation value to generate the compensation signal for performing the temperature compensation on the common electrode voltage of the display panel.

According to the temperature compensation circuit and the temperature compensation method provided in the embodiments of the present disclosure, the common electrode voltage Vcom can be adjusted according to a variation in the temperature so as to change the actual voltage applied to a pixel of the display panel, so that variation ranges of the positive and negative voltages are close to each other. In other words, by adjusting the drift of the common electrode voltage Vcom caused by the variation in temperature, the common electrode voltage is at the midpoint between variations of the positive and negative gray scales, so that the amount of flickers presented on the display panel can be maintained at minimum, and thus the displaying of picture can be more stable and the viewing experience of the user can be enhanced.

The above describes the temperature compensation circuit and the temperature compensation method for the common electrode voltage of the display panel according to the embodiments of the present disclosure. However, as can be understood by those skilled in the art, the specific structure of the above temperature compensation circuit and the respective steps of the corresponding temperature compensation method are only illustrative to illustrate the operational principle of the embodiments of the present disclosure, instead of being limitations on the present disclosure. One or more parts and/or steps therein can be combined with each other or be omitted depending on actual requirements and an application environment.

Those skilled in the art can understand that all or part of the flows for implementing the methods according to the embodiments of the present disclosure can be achieved by instructing related hardware through a computer program; the computer program may be stored in a computer readable storage medium and comprise the flows for implementing the methods according to the embodiments of the present disclosure as executed. The storage medium may be a magnetic disc, an optical disk, a Read Only Memory (ROM) or a Radom Access Memory (RAM) and the like.

The above descriptions only illustrate the specific embodiments of the present invention, and the protection scope of the present invention is not limited to this. Given the teaching as disclosed herein, variations or substitutions, which can easily occur to any skilled pertaining to the art, should be covered by the protection scope of the present invention. Thus, the protection scope of the present invention is defined by the claims.

What is claimed is:

1. A temperature compensation circuit for a display panel, comprising:
   a temperature detection unit configured to detect a variation in a temperature of the display panel;
   a temperature conversion unit connected to the temperature detection unit and configured to convert the detected variation in the temperature into a voltage compensation value; and
   a compensation signal generation unit connected to the temperature conversion unit and configured to process the voltage compensation value based on a function relationship between the temperature and a common electrode voltage of the display panel to generate a compensation signal for performing a temperature compensation on the common electrode voltage of the display panel,
   wherein the compensation signal generation unit comprises at least one of an addition compensation sub-unit, a subtraction compensation sub-unit, a multiplication compensation sub-unit and a division compensation sub-unit.

2. The temperature compensation circuit of claim 1, further comprising:
   a selection unit configured to select at least one of the addition compensation sub-unit, the subtraction compensation sub-unit, the multiplication compensation sub-unit and the division compensation sub-unit in the compensation signal generation unit to process the voltage compensation value, in order to generate the compensation signal.

3. The temperature compensation circuit of claim 2, further comprising:
   a storage unit configured to store amounts of flicker presented on the display panel at different temperatures and corresponding common electrode voltages; and
   an identification unit configured to identify the function relationship between the temperature and the common electrode voltage when the display panel presents a minimum amount of flicker based on the stored amounts of flicker at the different temperatures and the corresponding common electrode voltages, and to output a control signal to the selection unit.

4. The temperature compensation circuit of claim 3, wherein the selection unit is configured to select the at least one of the addition compensation sub-unit, the subtraction compensation sub-unit, the multiplication compensation sub-unit and the division compensation sub-unit to generate the compensation signal according to the control signal output from the identification unit.

5. The temperature compensation circuit of claim 4, wherein the temperature conversion unit comprises a first operational amplifier, wherein a non-inverting input terminal of the first operational amplifier is configured to receive the variation in temperature output from the temperature detection unit, an inverting input terminal thereof is grounded via a first resistor, and an output terminal thereof is connected to the inverting input terminal thereof via a first feedback resistor and is configured to output the converted voltage compensation value.

6. The temperature compensation circuit of claim 1, wherein the temperature detection unit comprises a temperature sensor, wherein the temperature sensor is a thermistor and is disposed on a signal driving circuit board of the display panel to detect the temperature surrounding the display panel.

7. The temperature compensation circuit of claim 1, wherein the temperature detection unit comprises a temperature sensor, wherein the temperature sensor is made of polysilicon and is disposed at Thin Film Transistors side inside the display panel to detect the temperature inside the display panel.

8. The temperature compensation circuit of claim 1, wherein the addition compensation sub-unit comprises
a second operational amplifier whose non-inverting input terminal is configured to receive the voltage compensation value and the common electrode voltage via a second resistor and a third resistor, respectively, whose inverting input terminal is grounded via a fourth resistor, and whose output terminal is connected to the inverting input terminal thereof via a second feedback resistor and is configured to output a sum of the common electrode voltage signal and the voltage compensation value as the compensation signal.

9. The temperature compensation circuit of claim 1, wherein the subtraction compensation sub-unit comprises:
a third operational amplifier whose non-inverting input terminal and inverting input terminal are configured to receive the common electrode voltage and the voltage compensation value via a fourth resistor and a fifth resistor, respectively, and whose output terminal is connected to the inverting input terminal thereof via a third feedback resistor and is configured to output a difference between the common electrode voltage signal and the voltage compensation value as the compensation signal.

10. The temperature compensation circuit of claim 1, wherein the multiplication compensation sub-unit comprises:
a fourth operational amplifier configured to perform a logarithm operation on a first signal received at its inverting input terminal and to output the same;
a fifth operational amplifier configured to perform a logarithm operation on a second signal received at its inverting input terminal and to output the same;
a sixth operational amplifier configured to perform an addition operation on signals output from the fourth operational amplifier and the fifth operational amplifier; and
a seventh operational amplifier configured to perform an exponent operation on a signal output from the sixth operational amplifier and to output a product of the first signal and the second signal as the compensation signal.

11. The temperature compensation circuit of claim 1, wherein the division compensation sub-unit comprises:
an eighth operational amplifier configured to perform a logarithm operation on a first signal received at its inverting input terminal and output the same;
a ninth operational amplifier configured to perform a logarithm operation on a second signal received at its inverting input terminal and output the same;
a tenth operational amplifier configured to perform a subtraction operation on signals output from the eighth operational amplifier and the ninth operational amplifier; and
an eleventh operational amplifier configured to perform an exponent operation on a signal output from the tenth operational amplifier in order to generate the compensation signal.

12. A liquid crystal display comprising the temperature compensation circuit of claim 1.

13. The liquid crystal display of claim 12, wherein the temperature compensation circuit further comprises:
a selection unit configured to select at least one of the addition compensation sub-unit, the subtraction compensation sub-unit, the multiplication compensation sub-unit and the division compensation sub-unit in the compensation signal generation unit to process the voltage compensation value, in order to generate the compensation signal.

14. The liquid crystal display of claim 13, wherein the temperature compensation circuit further comprises:
a storage unit configured to store amounts of flicker presented on the display panel at different temperatures and corresponding common electrode voltages; and
an identification unit configured to identify a function relationship between the temperature and the common electrode voltage when the display panel presents a minimum amount of flicker based on the stored amounts of flicker at the different temperatures and the corresponding common electrode voltages, and to output a control signal to the selection unit.

15. The liquid crystal display of claim 14, wherein the selection unit is configured to select the at least one of the addition compensation sub-unit, the subtraction compensation sub-unit, the multiplication compensation sub-unit and the division compensation sub-unit to generate the compensation signal according to the control signal output from the identification unit.

16. A temperature compensation method for a display panel, comprising:
detecting a variation in the temperature of the display panel;
converting the detected variation in the temperature into a voltage compensation value; and
processing the voltage compensation value based on a function relationship between the temperature and a common electrode voltage of the display panel to generate a compensation signal for performing a temperature compensation on the common electrode voltage of the display panel,
wherein the compensation signal is generated by at least one of an addition compensation sub unit, a subtraction compensation sub-unit, a multiplication compensation sub-unit and a division compensation sub-unit.

17. The temperature compensation method of claim 16, further comprises:
storing amounts of flicker of the display panel at different temperatures and corresponding common electrode voltages;
identifying the function relationship between the temperature of the display panel and the common electrode voltage in a case of a minimum amount of flicker based on the stored amounts of flicker of the display panel at the different temperatures and the corresponding common electrode voltages; and
based on the identified function relationship, selecting a corresponding process on the voltage compensation value to generate the compensation signal.

* * * * *